United States Patent
Sawada et al.

(10) Patent No.: US 9,136,295 B2
(45) Date of Patent: Sep. 15, 2015

(54) SEMICONDUCTOR DEVICE AND METHOD FOR MANUFACTURING THE SAME

(75) Inventors: Yoshiharu Sawada, Zama (JP); Sho Suzuki, Yamato (JP); Takehito Okabe, Atsugi (JP); Masatsugu Itahashi, Yokohama (JP); Takashi Usui, Ashigarakami-gun (JP); Junji Iwata, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 9 days.

(21) Appl. No.: 13/364,994

(22) Filed: Feb. 2, 2012

(65) Prior Publication Data

US 2012/0199928 A1 Aug. 9, 2012

(30) Foreign Application Priority Data

Feb. 9, 2011 (JP) .................................. 2011-026354
Oct. 7, 2011 (JP) .................................. 2011-223299

(51) Int. Cl.
*H01L 27/146* (2006.01)

(52) U.S. Cl.
CPC .... *H01L 27/14625* (2013.01); *H01L 27/14632* (2013.01); *H01L 27/14685* (2013.01); *H01L 27/14687* (2013.01)

(58) Field of Classification Search
USPC ................. 257/233, 291, 292, 294, 432–436
See application file for complete search history.

(56) References Cited

U.S. PATENT DOCUMENTS

| | | | |
|---|---|---|---|
| 7,420,236 B2* | 9/2008 | Hashimoto .................... 257/294 |
| 8,445,827 B2* | 5/2013 | Mizuta et al. .............. 250/208.1 |
| 8,492,864 B2* | 7/2013 | Watanabe ..................... 257/435 |
| 2007/0122935 A1* | 5/2007 | Kasano et al. .................... 438/73 |
| 2008/0135732 A1* | 6/2008 | Toumiya et al. ........... 250/208.1 |
| 2008/0237766 A1* | 10/2008 | Kim .............................. 257/432 |
| 2009/0278967 A1 | 11/2009 | Toumiya |
| 2010/0025571 A1 | 2/2010 | Toumiya |
| 2011/0024858 A1* | 2/2011 | Yoshihara et al. ............ 257/432 |
| 2012/0267742 A1* | 10/2012 | Yano ............................ 257/432 |

FOREIGN PATENT DOCUMENTS

| JP | 2006-229206 A | 8/2006 |
| JP | 2008-166677 A | 7/2008 |
| JP | 2009-272568 A | 11/2009 |

* cited by examiner

*Primary Examiner* — Benjamin Sandvik
(74) *Attorney, Agent, or Firm* — Canon USA, Inc. IP Division (57) ABSTRACT

There are provided a first waveguide member in an imaging region and a peripheral region of a semiconductor substrate and a via plug penetrating the first waveguide member.

7 Claims, 6 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same.

2. Description of the Related Art

In recent years, in a solid-state imaging device which is one type of semiconductor device, in order to increase the amount of light incident on a photoelectric conversion portion, a solid-state imaging device having an optical waveguide has been proposed.

Japanese Patent Laid-Open No. 2009-272568 has disclosed a solid-state imaging device having an etch stop film used for forming a waveguide. In addition, Japanese Patent Laid-Open No. 2009-272568 has also disclosed the structure in which a high-refractive-index member forming a waveguide is provided on a pad portion. The present inventors found out the following problems. According to the structure of the solid-state imaging device describe in Japanese Patent Laid-Open No. 2009-272568, a step is unfavorably formed between an imaging region and a peripheral region. Since irregularity in thickness of an insulating layer is generated by the step, for example, irregularity in image and irregularity in color are generated in the imaging region. In addition, it is difficult to form a structural body, such as an on-chip color filter or an on-chip microlens, on a layer having a step with a high precision. In addition, also in semiconductor devices other than solid-state imaging device, the height of the device is increased concomitant with an increase in degree of integration, and as a result, there has been a problem in that the planarization cannot be easily performed in a manufacturing process.

As described above, according to Japanese Patent Laid-Open No. 2009-272568, it has been difficult to provide a semiconductor device having a high precision and to form a semiconductor device with a high precision. In consideration of the above problems, the present inventors provide a method for manufacturing a semiconductor device which can easily perform planarization and a semiconductor device in which planarization is performed.

SUMMARY OF THE INVENTION

A semiconductor device according to one aspect of the present invention comprises a semiconductor substrate including a first region and a second region; an insulator which is arranged in the first region and the second region of the semiconductor substrate and which has an opening in the first region; a wiring layer enclosed by the insulator; a first member provided inside the opening and on the insulator in the second region; and a plug which includes a conductive material, which penetrates the first member provided on the insulator in the second region, and which is connected to the wiring layer.

In addition, a method for manufacturing a semiconductor substrate according to another aspect of the present invention is a method for manufacturing a semiconductor device which has a semiconductor substrate including a first region and a second region, an insulator arranged in the first region and the second region of the semiconductor substrate, and a wiring layer enclosed by the insulator, and the above method comprises the steps of: forming openings in a portion of the insulator arranged in the first region; forming a first member inside the openings and on the insulator in the second region after the step of forming openings; forming a through hole by removing at least a part of a portion of the first member arranged in the second region; and forming a plug.

In addition, a method for manufacturing a semiconductor substrate according to another aspect of the present invention is a method for manufacturing a semiconductor device which has a semiconductor substrate including a first region and a second region, an insulator including a first silicon nitride film arranged in the first region and the second region of the semiconductor substrate and a first silicon oxide film provided on the first silicon nitride film, and a wiring layer which is enclosed by the insulator and which is provided under the first silicon nitride film. The method for manufacturing a semiconductor device described above comprises the steps of: forming openings in a portion of the insulator arranged in the first region; forming a first member including a second silicon nitride film inside the openings and on the first silicon oxide film of the insulator in the second region after the step of forming openings; forming a second silicon oxide film on the second silicon nitride film in the second region, and forming a through hole by removing parts of portions of the first silicon nitride film, the first silicon oxide film, the second silicon nitride film, and the second silicon oxide film which are arranged in the second region to expose the wiring layer, and the step of forming a through hole includes a step of forming an opening in the first silicon nitride film, a step of forming an opening in the first silicon oxide film, a step of forming an opening in the second silicon nitride film, and a step of forming an opening in the second silicon oxide film.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENTS

The present invention can be applied to a semiconductor device having the structure in which a first region and a second region are provided in a semiconductor substrate, an insulator is provided thereon, a plurality of openings is provided in the insulator in the first region and the openings in the first region are filled with a filling member. In the structure as described above, a conductive plug penetrating the filling member which extends in the second region is provided.

The semiconductor device of the present invention can be applied, for example, to a solid-state imaging device. A solid-state imaging device is a semiconductor device having a semiconductor substrate on which photoelectric conversion portions and optical waveguides are arranged. In particular, the present invention can be applied to the case in which optical waveguides are formed, for example, by forming openings to correspond to the photoelectric conversion portions and filling a high refractive index material in the openings. In this case, the first region is an imaging region including the photoelectric conversion portions, and the second region is a peripheral region in which circuits processing signals generated in the photoelectric conversion portions are arranged. A plug penetrating the filling member of the optical waveguide which extends on the insulator in the peripheral region is provided. The plug has a function, for example, to electrically connect pads and/or wires in the peripheral region to wires provided thereunder. By the structure as described above in which the plug is provided to penetrate the filling member of the optical waveguide which extends on the insulator in the peripheral region, the flatness of the solid-state imaging device can be improved.

A preferable embodiment of the present invention will be described using a solid-state imaging device by way of example. First, a method for manufacturing a solid-state imaging device will be described. A semiconductor substrate 101 includes an imaging region 103 in which a plurality of photoelectric conversion portions 105 are arranged and a peripheral region 104 in which circuits processing signals from the photoelectric conversion portions 105 are arranged. An insulator is arranged on the semiconductor substrate 101. The insulator includes, for example, a plurality of interlayer insulating films 113a to 113e. A planarization treatment is appropriately performed on the interlayer insulating films 113a to 113e, and an upper surface of the insulator is made flat.

First, openings 116 are formed in the insulator. The openings are formed at positions which overlap the photoelectric conversion portions 105 in plan. Many photoelectric conversion portions 105 can be arranged in the imaging region 103. Therefore, the density of the opening thus arranged in the imaging region 103 is higher than that in the peripheral region 104.

Next, a first waveguide member 118 (first member) is formed on the insulator in which the openings are formed. The first waveguide member 118 is formed on the insulator arranged in the imaging region 103 so as to fill the insides of the openings 116 described above. Furthermore, the first waveguide member 118 is also formed on the insulator arranged in the peripheral region 104. In this step, the whole insides of the openings are not necessarily filled. Some air voids may remain inside the openings.

A portion of the first waveguide member 118 arranged in the peripheral region 104 is removed. As a removal method, for example, etching or lift-off may be used. The portion of the first waveguide member 118 to be removed will be described when viewed in plan and when viewed in a depth direction.

When viewed in plan, at least a part of the portion of the first waveguide member 118 arranged in the peripheral region 104 is removed. Most of the portion of the first waveguide member 118 arranged in the peripheral region 104 is preferably removed. The whole surface of the portion of the first waveguide member 118 arranged in the peripheral region 104 is more preferably removed.

As the degree of removal in a depth direction, at least a part of the first waveguide member 118 may be removed. That is, the thickness of the first waveguide member 118 arranged in the peripheral region 104 may be at least decreased. The removal is preferably performed to remain a part of the first waveguide member 118 so as not to expose the insulator functioning as an underlayer. However, all of the first waveguide member 118 may be removed in a depth direction. That is, the first waveguide member 118 may be removed until the insulator functioning as an underlayer is exposed.

After the portion of the first waveguide member 118 arranged in the peripheral region 104 is removed, the imaging region 103 and the peripheral region 104 are planarized. Accordingly, an upper surface of the first waveguide member 118 is made flat.

Subsequently, in order to electrically connect conductive members forming wires to each other, a conductive plug 121 is formed. The plug 121 is formed by forming a through hole in a region in which the plug 121 is to be formed and filling a conductive member in the through hole. The formation of the through hole includes a step of forming an opening in an interlayer insulating film 119, a step of forming an opening in the first waveguide member 118, and a step of forming an opening in the interlayer insulating film 113e and a diffusion preventing film 115. The openings of the individual films and member are provided continuously to form a through hole. In addition, the plug 121 is formed by providing a conductive member in the through hole. A third wiring layer is formed on the plug 121. Next, a planarizing layer 126 is formed. Since only the thickness of the third wiring layer forms a step, the flatness of the planarizing layer 126 is improved as compared to that of a related solid-state imaging device. Since the flatness of the planarizing layer 126 is improved, an on-chip color filter and/or an on-chip microlens can then be formed with a high precision.

In a method for manufacturing a semiconductor device, in general, a plurality of chips is formed in one wafer. In particular, in the solid-state imaging device, the imaging regions 103 and the peripheral regions 104 are alternately arranged at a relatively long cycle. Therefore, the step is liable to be generated at a long cycle. Since it is difficult to reduce the step as described above by chemical mechanical polishing (CMP) or a planarizing layer, in a related method for manufacturing a solid-state imaging device, the above problem has been particularly serious. Therefore, when the present invention is applied to a method for manufacturing a solid-state imaging device, the effect obtained thereby is significant.

Although the case in which electrons are used as signal charges will be described, of course, holes may also be used as signal charges. When holes are used as signal charges, the conductive types of semiconductor regions may be reversed.

EXAMPLE 1

A first example of a method for manufacturing a solid-state imaging device according to the present invention will be described with reference to the drawings. FIGS. 1A to 2C are schematic views each showing a cross-sectional structure of a solid-state imaging device in each step of this example.

A solid-state imaging device 100 has a semiconductor substrate 101. A semiconductor substrate is a semiconductor material portion among members forming a solid-state imaging device. For example, the semiconductor substrate includes a substrate in which a semiconductor region is formed in a semiconductor wafer by a known semiconductor manufacturing process. For example, silicon may be mentioned as a semiconductor material. An interface between the semiconductor material and another material is a principal surface 102 of the semiconductor substrate. For example, the another material is a thermally-oxidized film or the like which is arranged on the semiconductor substrate in direct contact therewith.

In this example, a known semiconductor substrate can be used for the semiconductor substrate 101. A p-type semiconductor region and an n-type semiconductor region are arranged in the semiconductor substrate 101. Reference numeral 102 indicates the principal surface of the semiconductor substrate 101. In this example, the principal surface 102 is an interface between the semiconductor substrate 101 and the thermally-oxidized film (not shown) laminated thereon. The semiconductor substrate 101 has an imaging region 103 in which a plurality of pixels is arranged and a peripheral region 104 in which signal processing circuits processing signals from the pixels are arranged. The imaging region 103 and the peripheral region 104 will be described later.

In addition, in this specification, a flat plane is a plane parallel to the principal surface 102. For example, the principal surface 102 in a region in which photoelectric conversion portions, which will be described later, are arranged or the principal surface 102 on a channel of an MOS transistor may be used as the base. In this specification, a cross section is a plane which perpendicularly intersects the flat plane.

Figure 1A:
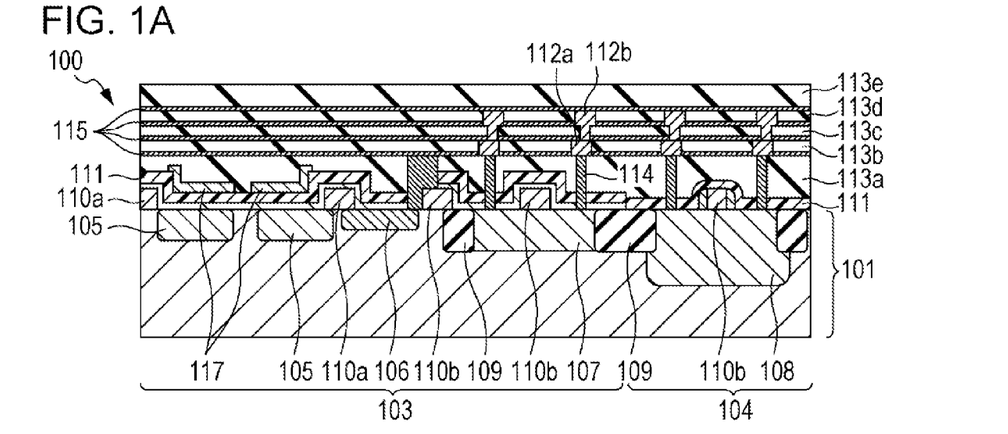
FIGS. 1A to 1C are schematic cross-sectional views each showing a method for manufacturing a solid-state imaging device of Example 1.

In a step shown in FIG. 1A, individual semiconductor regions are formed in the semiconductor substrate 101, and gate electrodes and multilayer wires are formed above the semiconductor substrate 101. In the imaging region 103 of the semiconductor substrate 101, photoelectric conversion portions 105, a floating diffusion (hereinafter referred to as "FD") 106, and source/drain regions of a pixel-transistor well 107 are formed. The photoelectric conversion portion 105 is, for example, a photodiode. The photoelectric conversion portion 105 includes an n-type semiconductor region arranged in the semiconductor substrate 101. Electrons generated by photoelectric conversion are collected in the n-type semiconductor region of the photoelectric conversion portion. The FD 106 is an n-type semiconductor region. Electrons generated in the photoelectric conversion portion 105 are transferred to the FD 106 and are converted into a voltage. The FD 106 is electrically connected to an input node of an amplification portion. Alternatively, the FD 106 is electrically connected to a signal output line. In this example, the FD 106 is electrically connected to an amplification-transistor gate electrode 110b through a plug 114. In the pixel-transistor well 107, source/drain regions of an amplification transistor which amplifies a signal, a reset transistor which resets an input node of the amplification transistor, and the like are formed. A peripheral-transistor well 108 is formed in the peripheral region 104 of the semiconductor substrate 101. Source/drain regions of a peripheral transistor forming a signal processing circuit are formed in the peripheral-transistor well 108. In addition, an element isolation portion 109 may be formed in the semiconductor substrate 101. The element isolation portion 109 electrically isolates a pixel transistor or a peripheral transistor from other elements. The element isolation portion 109 is, for example, sallow trench isolation (STI) or local oxidation of silicon (LOCOS).

In addition, in this step, a transfer gate electrode 110a and the gate electrodes 110b are formed. The transfer gate electrode 110a and the gate electrodes 110b are arranged on the semiconductor substrate 101 with an oxide film (not shown) provided therebetween. The transfer gate electrode 110a controls transfer of a charge between the photoelectric conversion portion 105 and the FD 106. The gate electrodes 110b are the gate of the pixel transistor and that of the peripheral transistor.

Furthermore, in this step, a protective layer 111 is formed on the semiconductor substrate 101. For example, the protective layer 111 is formed of a silicon nitride film. In addition, the protective layer 111 may also be formed of a plurality of layers containing a silicon nitride film and a silicon oxide film. The protective layer 111 may have a function to reduce damage done to the photoelectric conversion portion in a subsequent step. Alternatively, the protective layer 111 may also have an antireflection function. Alternatively, the protective layer 111 may also have a function to prevent diffusion of a metal in a silicide step. In addition, an etch stop member 117 is formed on the protective layer 111 at a side opposite to the semiconductor substrate 101. An area of the etch stop member 117 is preferably larger than an area of a bottom of the opening 116 which will be formed later. In addition, the protective layer 111 and the etch stop member 117 are not necessarily formed.

Subsequently, a first wiring layer 112a, a second wiring layer 112b, and the plurality of interlayer insulating films 113a to 113e are formed. In this example, the first wiring layer 112a and the second wiring layer 112b are formed by a damascene method. For convenience, the interlayer insulating films are designated by a first to a fifth interlayer insulating film 113a to 113e in this order from the semiconductor substrate 101.

The first interlayer insulating film 113a is formed in the imaging region 103 and the peripheral region 104. A surface of the first interlayer insulating film 113a opposite to the semiconductor substrate 101 may be planarized, if needed. Through holes are formed in the first interlayer insulating film 113a. The plug 114 which electrically connects a conductive member of the first wiring layer 112a and the semiconductor region of the semiconductor substrate 101 is arranged in each through hole. The plug 114 is formed of a conductive material. For example, the plug 114 is formed of tungsten.

Next, the second interlayer insulating film 113b is formed on the first interlayer insulating film 113a at a side opposite to the semiconductor substrate 101. Portions of the second interlayer insulating film 113b each corresponding to a region in which the conductive member of the first wiring layer 112a is arranged are removed by etching. Subsequently, a metal film used as a material of the first wiring layer is formed in the imaging region 103 and the peripheral region 104. Next, the metal film is removed until the second interlayer insulating film is exposed by a method, such as CMP. By the procedure as described above, the conductive member forming the wire of the first wiring layer 112a is arranged to have a predetermined pattern.

Then, the third interlayer insulating film 113c and the fourth interlayer insulating film 113d are formed in the imaging region 103 and the peripheral region 104. Next, portions of the fourth interlayer insulating film 113d each corresponding to a region in which a conductive member of the second wiring layer 112b is arranged are removed by etching. Subsequently, portions of the third interlayer insulating film 113c each corresponding to a region in which a plug which electrically connects the conductive member of the first wiring layer 112a and the conductive member of the second wiring layer 112b is arranged are removed by etching. Then, a metal film used as a material of the second wiring layer and the plugs is formed in the imaging region 103 and the peripheral region 104. Next, the metal film is removed until the fourth interlayer insulating film is exposed by a method, such as CMP. By the procedure as described above, a wiring pattern of the second wiring layer 112b and a pattern of the plugs are obtained. Alternatively, after the third interlayer insulating film 113c and the fourth interlayer insulating film 113d are formed, the portions each corresponding to the region in which the plug which electrically connects the conductive member of the first wiring layer 112a and the conductive member of the second wiring layer 112b is arranged may be first removed by etching.

Finally, the fifth interlayer insulating film 113e is formed in the imaging region 103 and the peripheral region 104. A surface of the fifth interlayer insulating film 113e opposite to the semiconductor substrate 101 may be planarized by a method, such as CMP, if needed.

In addition, the first wiring layer 112a and the second wiring layer 112b may be formed by a method other than a damascene method. One example of the method other than a damascene method will be described. After the first interlayer insulating film 113a is formed, a metal film used as a material of the first wiring layer is formed in the imaging region 103 and the peripheral region 104. Next, a portion of the metal film other than a region in which the conductive member of the first wiring layer 112a is arranged is removed by etching. By this step, a wiring pattern of the first wiring layer 112a is obtained. Subsequently, the second interlayer insulating film 113b and the third interlayer insulating film 113c are formed, and the second wiring layer 112b is formed as in the case described above. After the second wiring layer 112b is formed, the fourth interlayer insulating film 113d and the fifth interlayer insulating film 113e are formed. A surface of the third interlayer insulating film 113c and that of the fifth interlayer insulating film 113e opposite to the semiconductor substrate 101 are planarized, if needed.

The first wiring layer 112a and the second wiring layer 112b are arranged at different heights from the principal surface of the semiconductor substrate 101 which is used as the base. In this example, the conductive member of the first wiring layer 112a and that of the second wiring layer 112b are each formed of copper. As long as a conductive material is used for the conductive member, a material other than copper may also be used. Except for a portion other than that electrically connected by the plug, the conductive member of the first wiring layer 112a and that of the second wiring layer 112b are insulated from each other with the interlayer insulating film 113c. In addition, the number of the wiring layers is not limited to two, and the wiring layer may be a single layer or a laminate containing at least three layers.

In addition, in each place between the individual interlayer insulating films, an etch stop film, a metal-diffusion preventing film, or a film having the two functions of the above two films may be arranged. In this example, the interlayer insulating films 113a to 113e are each a silicon oxide film. For the silicon oxide film, a silicon nitride film functions as a metal-diffusion preventing film. Hence, the diffusion preventing film 115 is arranged in each place between the interlayer insulating films. In addition, the diffusion preventing film 115 is not necessarily arranged.

Figure 1B:
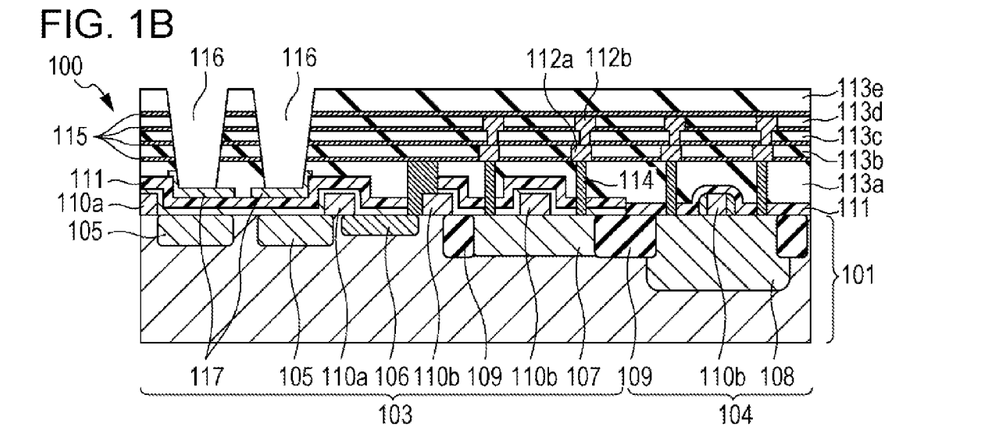

In FIG. 1B, the openings 116 are each formed in a region of the interlayer insulating films 113a to 113e which overlaps the photoelectric conversion portion 105 in plan. When the diffusion preventing films 115 are arranged, the openings are also formed therein.

First, a mask pattern (not shown) for etching is laminated on the interlayer insulating film 113e at a side opposite to the semiconductor substrate 101. The mask pattern for etching is arranged in a region other than the region in which the openings 116 are to be arranged. In other words, the mask pattern for etching has openings in regions in which the openings 116 are to be arranged. The mask pattern for etching is a photoresist patterned, for example, by photolithography and development.

Subsequently, the interlayer insulating films 113a to 113e and the diffusion preventing films 115 are etched by using the mask pattern for etching as a mask. Accordingly, the openings 116 are formed. In addition, by performing etching steps having different conditions, the openings 116 may be formed. The mask pattern for etching may be removed after the etching.

When the etch stop member 117 is arranged, in the step shown in FIG. 1B, etching is preferably performed until the etch stop member 117 is exposed. The etch stop member 117 preferably has a lower etching rate under etching conditions for etching the interlayer insulating film 113a than the etching rate thereof. When the interlayer insulating film 113a is a silicon oxide film, the etch stop member 117 may be formed of a silicon nitride film or a silicon oxynitride film. In addition, by performing etching steps having different conditions, the etch stop member 117 may be exposed.

As for the cross-sectional shape of the opening 116, the opening 116 is not necessarily to penetrate all the first to the fifth interlayer insulating film 113a to 113e. A recess of the fifth interlayer insulating film 113e may be the opening 116. In addition, the opening 116 may penetrate only some of the first to the fifth interlayer insulating films 113a to 113e. As for the planar shape of the opening 116, the boundary thereof is a closed loop, such as a circle or a quadrangle. In addition, the planar shape of the opening 116 may be a groove or the like extending over the photoelectric conversion portions 105. That is, in this specification, when a region in a certain plane in which the interlayer insulating film 113e is not arranged is enclosed by a region in which the interlayer insulating film 113e is arranged or is sandwiched between regions, in each of which the interlayer insulating film 113e is arranged, it is regarded that the interlayer insulating film 113e has the opening 116.

As for the position of the opening 116 in plan, at least a part of the opening 116 is arranged to overlap the photoelectric conversion portion 105 in plan. That is, when the opening 116 and the photoelectric conversion portion 105 are projected on the same plane, there is a region in which both the opening 116 and the photoelectric conversion portion 105 are projected on the same plane.

In this example, the openings 116 are formed in regions which overlap the respective photoelectric conversion portions 105, and no openings 116 are formed in the peripheral region 104. However, the openings 116 may also be formed in the peripheral region 104. In the case described above, the density of the opening 116 formed in the imaging region 103 may be higher than that of the opening 116 formed in the peripheral region 104. The density of the opening 116 can be determined by the number of the openings 116 arranged per unit area. Alternatively, the density of the opening 116 may also be determined by the rate of an area of the openings 116.

Figure 1C:
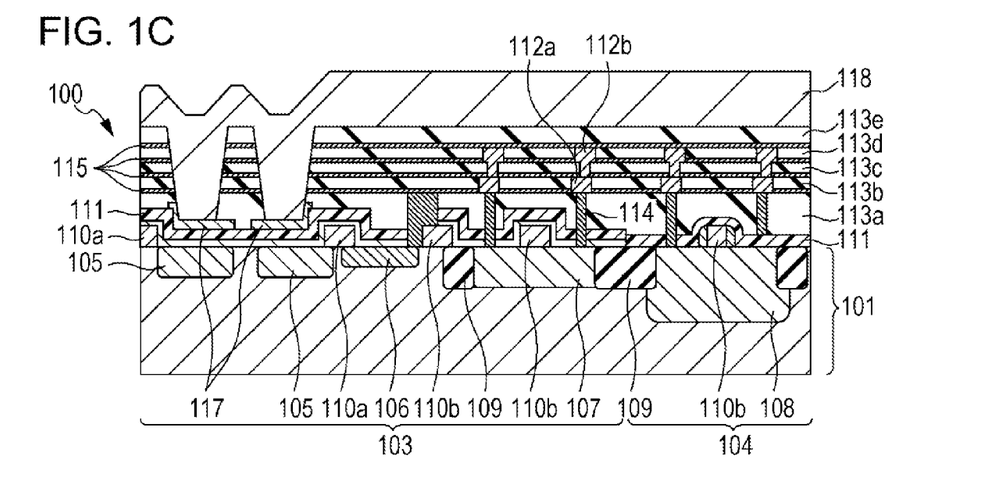

In FIG. 1C, the first waveguide member 118 (first member) is formed inside the openings 116 and on the fifth interlayer insulating film 113e. In particular, the first waveguide member 118 is formed in the imaging region 103 and the peripheral region 104. Formation of the first waveguide member 118 can be performed by film formation using chemical vapor deposition (CVD) or sputtering or by application of an organic material represented by a polyimide resin. In addition, by using steps having different conditions, the first waveguide member 118 may also be formed. For example, the first waveguide member 118 may be formed in such a way that a first step is performed under conditions in which the adhesion to an underlayer is increased and a next step is performed under conditions in which filling properties into the opening 16 are improved. Alternatively, the first waveguide member 118 may be formed by sequentially using different materials. For example, the first waveguide member 118 may be formed in such a way that a silicon nitride film is first deposited, and an organic material having high filling properties is then deposited. In addition, in the step shown in FIG. 1B, when the first interlayer insulating film 113a is etched until the etch stop member 117 is exposed, the first waveguide member 118 is arranged so as to be in contact with the etch stop member 117.

As a material of the first waveguide member 118, a material having a higher refractive index than that of each of the interlayer insulating films 113a to 113e may be used. When the interlayer insulating films 113a to 113e are each a silicon oxide film, as the material of the first waveguide member 118, for example, a silicon nitride film or a polyimide-based organic material may be mentioned. The silicon nitride film has a refractive index in a range of 1.7 to 2.3. The refractive index of a surrounding silicon oxide film is in a range of 1.4 to 1.6. Therefore, based on Snell's law, light incident on the interface between the first waveguide member 118 and each of the interlayer insulating films 113a to 113e is reflected. Accordingly, the light can be confined inside the first waveguide member 118. In addition, the content of hydrogen in a silicon nitride film can be increased, and by a hydrogen supply effect, dangling bonds of the substrate can be terminated. Hence, noises, such as white spots, can be reduced. The refractive index of a polyimide-based organic material is approximately 1.7. The filling properties of the polyimide-based organic material are superior to those of a silicon nitride film. The material of the first waveguide member 118 is appropriately selected in consideration of balance between the optical properties, such as the difference in refractive index, and the advantages from a manufacturing point of view.

Hereinafter, the positional relationship between the first waveguide member 118 arranged in the openings 116 and the interlayer insulating films 113a to 113e will be described. A region in a certain plane in which the first waveguide member 118 is arranged is enclosed by or sandwiched between regions in which the interlayer insulating films 113a to 113e are arranged. In other words, along a direction intersecting a direction in which the photoelectric conversion portion 105 and the first waveguide member 118 arranged in the opening 116 are disposed, a first portion of the interlayer insulating films 113a to 113e, a second portion thereof different from the first portion, and the first waveguide member 118 arranged in the opening 116 are disposed. The direction intersecting the direction in which the photoelectric conversion portion 105 and the first waveguide member 118 arranged in the opening 116 are disposed is, for example, a direction parallel to the principal surface 102 of the semiconductor substrate 101.

The first waveguide member 118 is arranged at a position which overlaps the photoelectric conversion portions 105 in the semiconductor substrate 101. The interlayer insulating films 113a to 113e are arranged along the periphery of the first waveguide member 118. The refractive index of the material forming the first waveguide member 118 is preferably higher than that of each of the interlayer insulating films 113a to 113e. By the relationship between the refractive indexes as described above, of the light incident on the first waveguide member 118, the amount of light leaking to the interlayer insulating films 113a to 113e can be reduced. Therefore, when at least a part of the first waveguide member 118 is arranged to overlap the photoelectric conversion portion 105, the amount of light incident on the photoelectric conversion portion 105 can be increased.

The refractive index of the first waveguide member 118 is not necessarily required to be higher than that of each of the interlayer insulating films 113a to 113e. When it is configured that light incident on the first waveguide member 118 is prevented from leaking to the surrounding insulator, this structure functions as an optical waveguide. For example, the structure may be formed in such a way that a member reflecting light is arranged along a side wall of the opening 116, and the first waveguide member 118 is filled in the other portion of the opening 116. In addition, air gaps may be present between the first waveguide member 118 arranged in the opening 116 and the interlayer insulating films 113a to 113e. The air gap may be in a vacuum state or may contain a gas. In the case described above, the relationship in magnitude between the refractive index of the material forming the first waveguide member 118 and the refractive index of the material forming each of the interlayer insulating films 113a to 113e may not be particularly limited.

Subsequently, in a step shown in FIG. 2A, the portion of the first waveguide member 118 arranged in the peripheral region 104 is removed. First, an etching mask (not shown) is laminated on the first waveguide member 118. The etching mask has an opening at a position of the peripheral region 104. Next, the portion of the first waveguide member 118 arranged in the peripheral region 104 is removed by etching.

In this step, the portion of the first waveguide member 118 arranged in the peripheral region 104 is preferably etched so that only a predetermined thickness of the first waveguide member 118 remains. Since the first waveguide member 118 having a predetermined thickness is present, damage done to a semiconductor substrate side by etching can be reduced. Of course, the first waveguide member 118 may be removed until the fifth interlayer insulating film 113e is exposed.

In this example, the portion of the first waveguide member 118 arranged in the peripheral region 104 is all etched off. In other words, the etching mask is not arranged in the peripheral region 104. As described above, the area to be etched is preferably large. However, the portion of the first waveguide member 118 arranged in the peripheral region 104 may only be partially etched. In this example, the area indicates an area in a flat plane.

A method for removing the portion of the first waveguide member 118 arranged in the peripheral region 104 is not limited to etching. For example, the first waveguide member 118 may be partially removed by lift-off. In particular, before the first waveguide member 118 is formed, an underlayer film is formed in the peripheral region 104. By removing the underlayer film after the first waveguide member 118 is formed, the first waveguide member 118 arranged on the underlayer film is also removed at the same time.

In addition, in this step, the first waveguide member 118 arranged in the imaging region 103 may also be partially removed.

Figure 2A:
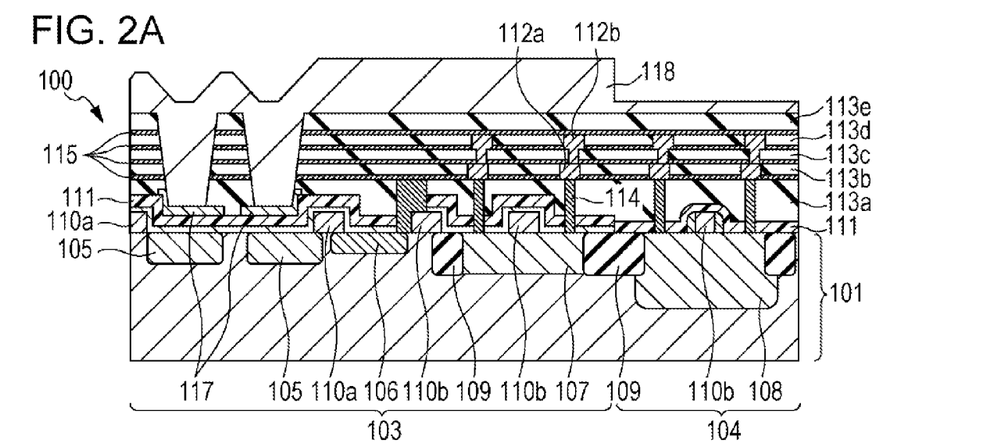
FIGS. 2A to 2C are schematic cross-sectional views each showing the method for manufacturing a solid-state imaging device of Example 1.
Figure 2B:
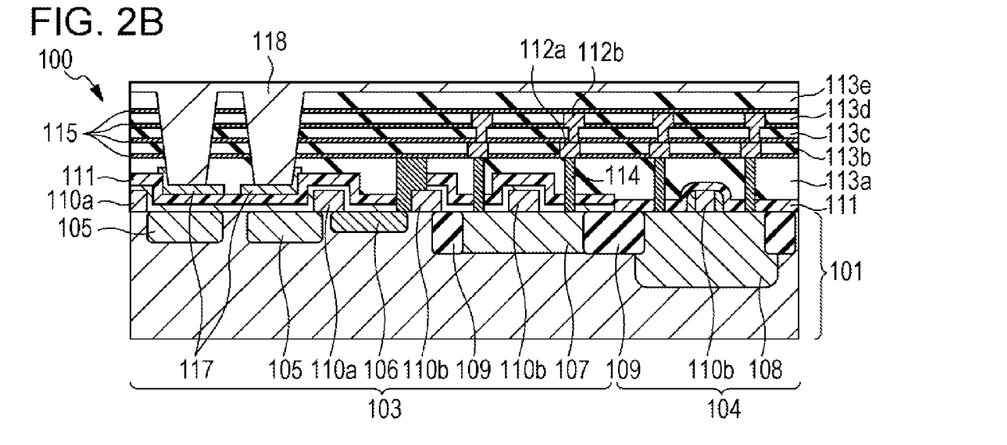

In a step shown in FIG. 2B, a surface of the first waveguide member 118 opposite to the semiconductor substrate 101 is planarized. The first waveguide member 118 is planarized, for example, by CMP, polishing, or etching. Planarization is performed by CMP in this example.

In the step shown in FIG. 2B, the surface of the first waveguide member 118 opposite to the semiconductor substrate 101 is not required to be completely flat. A step of the surface of the first waveguide member 118 opposite to the semiconductor substrate 101 before the planarization is performed may be reduced by the planarization step. For example, in the peripheral region 104, the thickness of the first waveguide member 118 after the planarization is performed is preferably in a range of 200 to 500 nm. In addition, in an area of the imaging region 103 in which the opening 116 is not arranged, the thickness of the first waveguide member 118 after the planarization is performed is preferably in a range of 50 to 350 nm.

In addition, in this example, the surface of the first waveguide member 118 opposite to the semiconductor substrate 101 is exposed in the planarization step. Therefore, the exposed surface of the first waveguide member 118 arranged in the imaging region 103 and the exposed surface of the first waveguide member 118 arranged in the peripheral region 104 are planarized. When another member is formed on the first waveguide member 118, an exposed surface of the another member is planarized. Alternatively, when the first waveguide member 118 is removed until the fifth interlayer insulating film 113e functioning as an underlayer is exposed in the step shown in FIG. 2A, the exposed surface of the fifth interlayer insulating film 113e is planarized.

The planarization in this step may be performed so that the step between the exposed surface in the imaging region 103 and the exposed surface in the peripheral region 104 is reduced. Alternatively, the planarization may be performed so that the inside of the exposed surface in the imaging region 103 is planarized, and the inside of the exposed surface in the peripheral region 104 is simultaneously planarized.

Figure 2C:
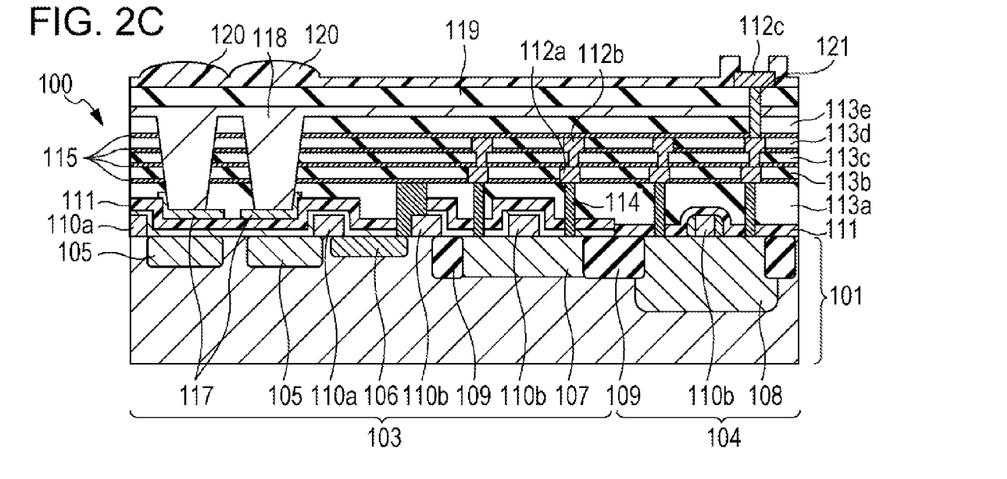

Subsequently, in a step shown in FIG. 2C, the sixth interlayer insulating film 119, a third wiring layer 112c, and inner-layer lenses 120 are formed. First, the sixth interlayer insulating film 119 is formed on the first waveguide member 118. The sixth interlayer insulating film 119 is preferably formed from the same material as that of the fifth interlayer insulating film 113e. In this example, the sixth interlayer insulating film 119 is a silicon oxide film. Next, a through hole for forming the plug 121 which electrically connects the predetermined conductive member of the second wiring layer 112b and a predetermined conductive member of the third wiring layer 112c is formed. The plug 121 is formed in the through hole. The plug 121 is formed, for example, of a conductive material containing tungsten as a primary component and contains a barrier metal.

In this example, a first step to a fourth step are performed as a process for forming the through hole. The first step is a step of forming an opening in the sixth interlayer insulating film 119, and the second step is a step of forming an opening in the first waveguide member 118. The third step is a step of forming an opening in the fifth interlayer insulating film 113e, and the fourth step is a step of forming an opening in the diffusion preventing film 115. On the second wiring layer on which the through hole is to be formed, the diffusion preventing film 115, the fifth interlayer insulating film 113e, the first waveguide member 118, and the sixth interlayer insulating film 119 are laminated in this order from the second wiring layer. In this case, as the diffusion preventing film 115, a first silicon nitride film is used, and as the fifth interlayer insulating film 113e, a first silicon oxide film is used. In addition, as the first waveguide member 118, a second silicon nitride film is used, and as the sixth interlayer insulating film 119, a second silicon oxide film is used. An opening, that is, the through hole, is formed by performing etching on the region of the laminated structure as described above.

In this case, when an etching rate of the silicon oxide film is represented by A, and an etching rate of the silicon nitride film is represented by B, in the first step and the third step, etching is performed under conditions in which A>B is satisfied, and in the second step and the fourth step, etching is performed under conditions in which B>A is satisfied. In each step, a film located under the film to be etched can be used as an etch stop film. By the manufacturing method as described above, a through hole for plug formation can be formed with a high precision. Besides the combination between a silicon nitride film and a silicon oxide film, this method can also be applied to the case in which two types of films are alternately laminated to each other.

Furthermore, etching is preferably performed under conditions in which a ratio A/B of the rate A to the rate B in the third step is smaller than a ratio A/B of the rate A to the rate B in the first step. Under the conditions as described above, the difference between the amount of the second silicon oxide film etched in the third step and the amount of the second silicon nitride film etched therein can be decreased. Therefore, the conformity in shape between the opening in the second silicon oxide film and the opening in the second silicon nitride film can be maintained.

In addition, a reducing atmosphere level in the second step is preferably increased than that in the fourth step. In order to increase the reducing atmosphere level, for example, there may be mentioned a step of increasing the amount of a reducing gas, a step of decreasing the amount of an oxidizing gas, or a step of performing the above two steps at the same time. By the conditions as described above, the second wiring layer can be prevented from being oxidized, and decrease in electrical properties can be suppressed.

In addition, a photoresist pattern is formed before the first to the third steps are performed, and etching is performed using the photoresist pattern as a mask in the first to the third steps. However, in the last fourth step, after the photoresist pattern is removed, etching is preferably performed using the sixth interlayer insulating film 119, the first waveguide member 118, and the fifth interlayer insulating film 113e as a mask. The reason for this is that when a member formed of an organic material, such as a photoresist, is present, carbon may be scattered in etching and may be mixed with copper to decrease the electrical properties.

Next, the third wiring layer 112c is formed. In this example, the conductive member of the third wiring layer 112c is formed of aluminum. As a method for forming the third wiring layer 112c, the method described for forming the first wiring layer 112a or the second wiring layer 112b is appropriately used.

Next, the inner-layer lenses 120 are formed. The inner-layer lenses 120 are arranged to correspond to the respective photoelectric conversion portions 105. The inner-layer lens 120 is formed, for example, of a silicon nitride film. A known method may be used as a method for forming the inner-layer lens 120. Subsequently, if needed, color filters, microlenses, and the like are formed on the inner-layer lens 120 at a side opposite to the semiconductor substrate 101.

Figure 3:
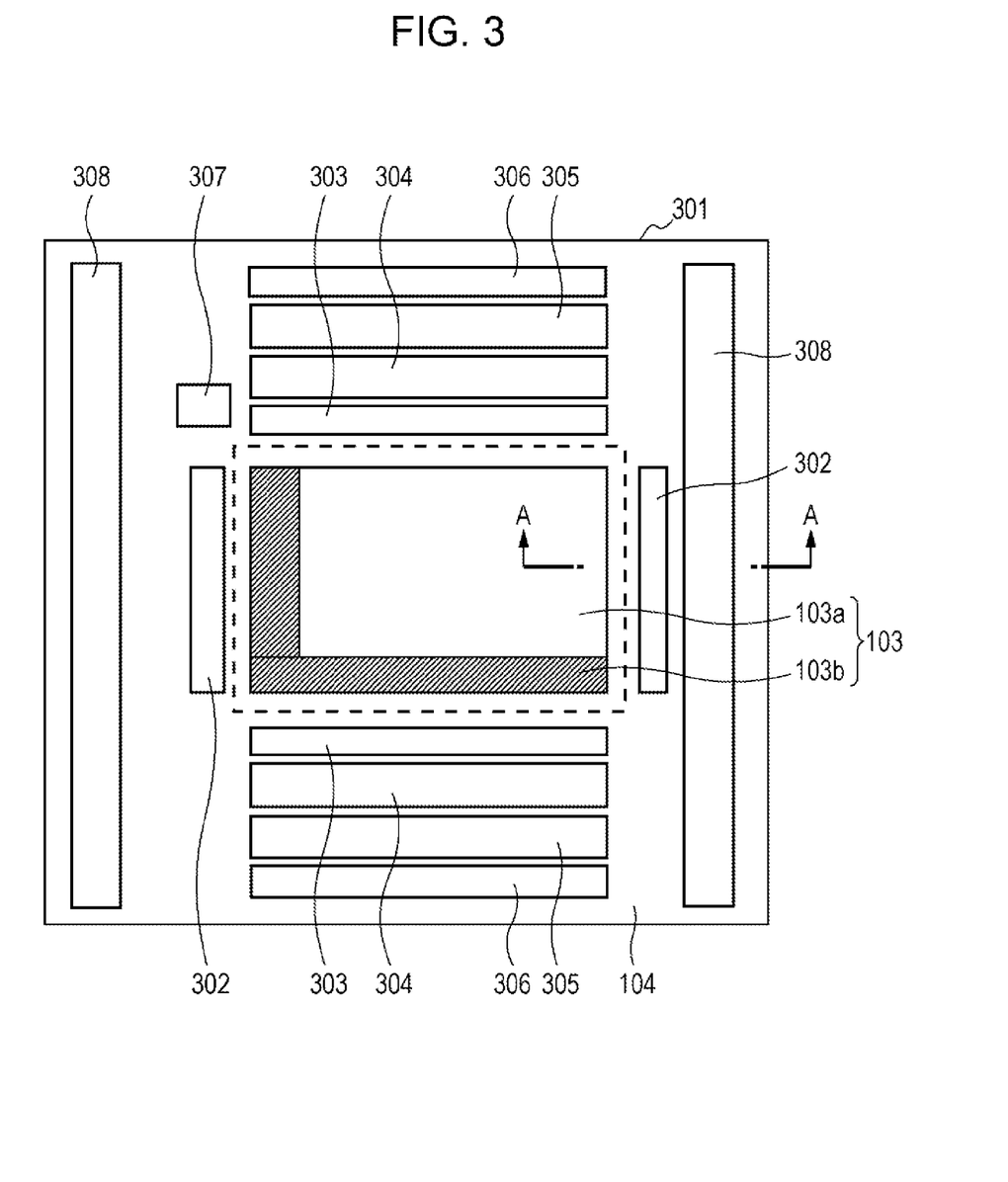
FIG. 3 is a schematic view showing a planar structure of the solid-state imaging device of Example 1.

FIG. 3 is a schematic view showing a planar structure of a solid-state imaging device of this example. A cross-section along the line AA shown in FIG. 3 is shown in FIGS. 1A to 2C.

In FIG. 3, the solid-state imaging device 100 includes the imaging region 103 and the peripheral region 104. The imaging region 103 may further include a light-receiving region 103a and a light-shading region 103b. In the imaging region 103, a plurality of pixels is arranged in a two-dimensional matrix. A photoelectric conversion portion of a pixel arranged in the light-shading region 103b is shaded. A signal from the pixel as described above can be used as the base of a black level.

The peripheral region 104 is a region other than the imaging region 103. In this example, vertical scanning circuits 302, horizontal scanning circuits 303, column amplifiers 304, column analog to digital convertors (ADCs) 305, memories 306, a timing generator 307, and a plurality of pads 308 are arranged in the peripheral region 104. These circuits are circuits (signal processing circuits) for processing signals from the pixels. In addition, some of the above circuits may not be arranged.

In this example, a region in which the first waveguide member 118 is removed is a region 301 outside a dashed line shown in FIG. 3. As shown in FIG. 3, it is preferable that most of the peripheral region 104 be the region 301.

In this example, when the first waveguide member 118 is formed, in a surface used as an underlayer thereof, the openings 116 are arranged. The openings 116 are arranged only in the imaging region 103. Alternatively, the density of the opening 116 arranged in the imaging region 103 is higher than the density of the opening arranged in the peripheral region 104. Therefore, compared to the region in which many openings 116 are arranged, the first waveguide member 118 is formed thick in the region in which the number of the openings 116 is small. That is, a step is formed between the region (imaging region 103) in which many openings 116 are arranged and the region (peripheral region 104) in which the number of the openings 116 is small. Accordingly, when the portion of the first waveguide member 118 arranged in the peripheral region 104 is removed, this step can be reduced.

EXAMPLE 2

A second example of the method for manufacturing a solid-state imaging device according to the present invention will be described. FIGS. 4A to 6B are schematic views each showing a cross-sectional structure of a solid-state imaging device in each step of this example. Portions having functions similar to those described with reference to FIGS. 1A to 2C are designated by the same reference numerals, and detailed description is omitted.

Figure 4A:
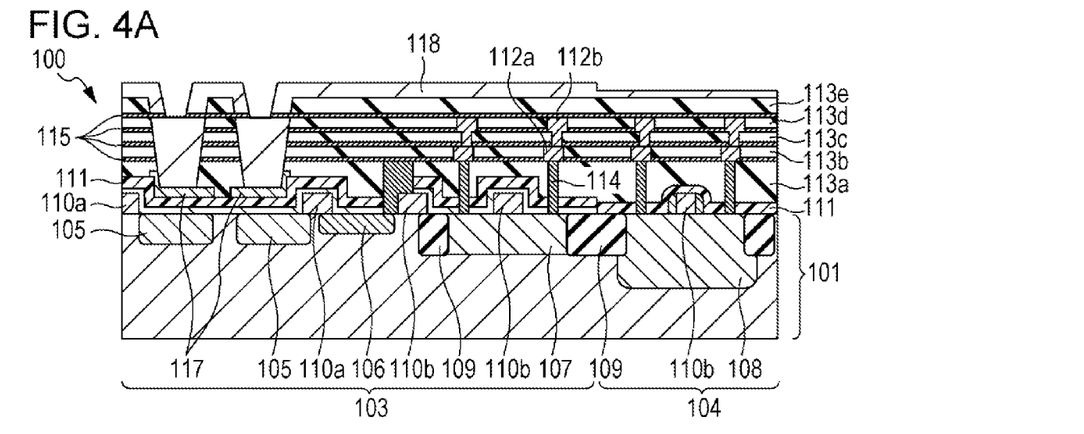
FIGS. 4A to 4C are schematic cross-sectional views each showing a method for manufacturing a solid-state imaging device of Example 2.

FIG. 4A shows the same step as that shown in FIG. 2A of Example 1. That is, FIG. 4A shows the state in which the portion of the first waveguide member 118 arranged in the peripheral region 104 is removed. The preceding steps and the step shown in FIG. 4A of the manufacturing method of this example are similar to the steps shown in FIGS. 1A to 2A.

Figure 4B:
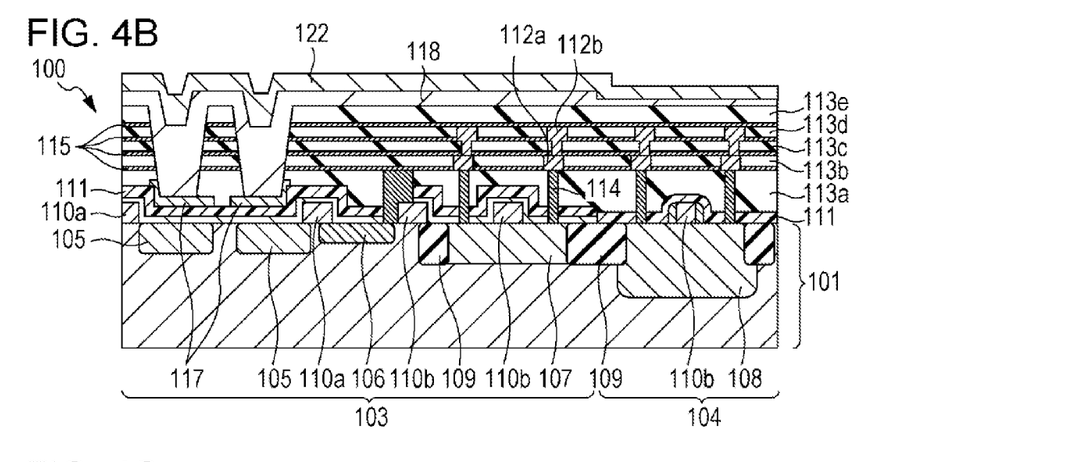

In the step shown in FIG. 4B, a second waveguide member 122 (second member) is formed on the first waveguide member 118 at a side opposite to the semiconductor substrate 101. The second waveguide member 122 is formed in the imaging region 103 and the peripheral region 104. In this example, the difference between the step of forming the first waveguide member 118 and the step of forming the second waveguide member 122 is that between the above two steps, a step of removing the portion of the first waveguide member 118 arranged in the peripheral region 104 is performed. Therefore, the second waveguide member 122 may be formed using the same material as that of the first waveguide member 118. Alternatively, the second waveguide member 122 may be formed by the same method as that used for forming the first waveguide member 118. Of course, the second waveguide member 122 may be formed using a material different from that of the first waveguide member 118 and may be formed using a method different from that for forming the first waveguide member 118.

In this example, the first waveguide member 118 and the second waveguide member 122 are formed from the same material. In particular, the second waveguide member 122 is formed from a silicon nitride. In this case, the second waveguide member 122 can be formed by CVD or sputtering. Alternatively, the second waveguide member 122 may be formed by application of an organic material represented by a polyimide resin.

In this example, the first waveguide member 118 and the second waveguide member 122 are both formed by CVD. However, the process conditions therefor are different from each other. In addition, the second waveguide member 122 may be formed by performing a plurality of steps under different conditions. Furthermore, the second waveguide member 122 may be formed by sequentially using a plurality of different materials.

Figure 4C:
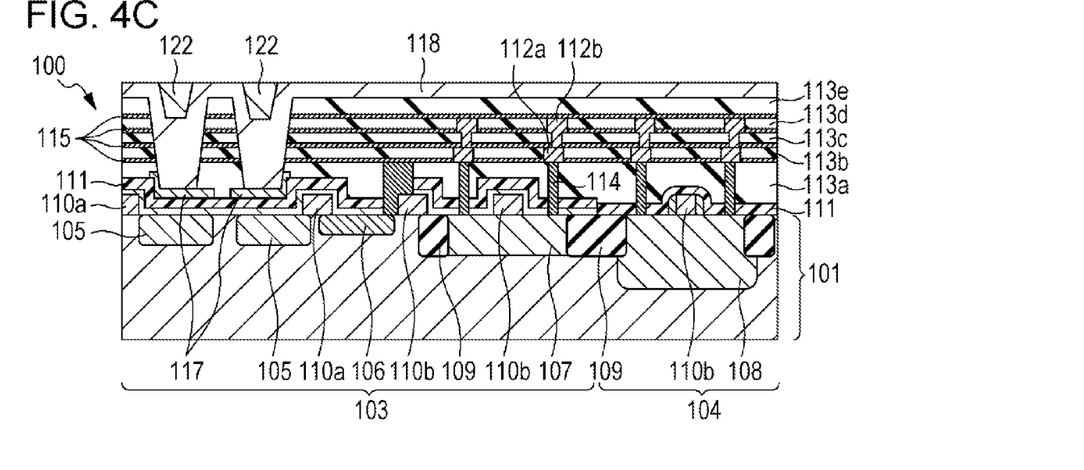

FIG. 4C shows a planarization step performed after the second waveguide member 122 is formed. In this example, a surface of the second waveguide member 122 opposite to the semiconductor substrate 101 is planarized by CMP. The planarization can be performed by a known method. For example, the planarization may be performed by polishing or etching. In addition, by the planarization, the first waveguide member 118 or a member provided at a semiconductor substrate 101 side than the second waveguide member 122 may be exposed. In this example, the first waveguide member 118 is exposed in the peripheral region 104. In addition, the second waveguide member 122 remains in the imaging region 103. However, the second waveguide member 122 may also remain in the peripheral region 104.

In addition, in the step shown in FIG. 4C, the surface of the second waveguide member 122 opposite to the semiconductor substrate 101 is not required to be completely flat. The step of the surface of the second waveguide member 122 opposite to the semiconductor substrate 101 before the planarization step may be reduced thereby. For example, in the peripheral region 104, the total thickness of the first waveguide member 118 and the second waveguide member 122, each of which is planarized, is preferably in a range of 200 to 500 nm. In addition, in a region of the imaging region 103 in which no openings 116 are formed, the total thickness of the first waveguide member 118 and the second waveguide member 122, each of which is planarized, is preferably in a range of 50 to 350 nm.

In addition, in this example, the surface of the second waveguide member 122 opposite to the semiconductor substrate 101 is exposed in the planarization step. When another member is formed on the second waveguide member 122, an exposed surface of the another member is planarized.

Figure 5A:
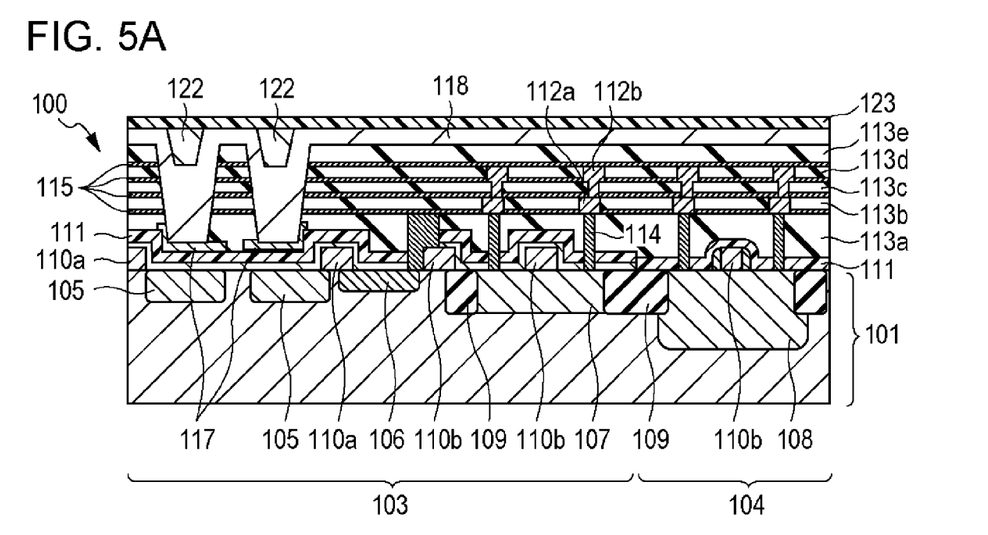
FIGS. 5A and 5B are schematic cross-sectional views each showing the method for manufacturing a solid-state imaging device of Example 2.

A low-refractive-index member 123 is formed in a step shown in FIG. 5A. The refractive index of the low-refractive-index member 123 is lower than that of a member which is arranged at the semiconductor substrate 101 side rather than the low-refractive-index member 123 and which is in contact therewith. The member arranged at the semiconductor substrate 101 side rather than the low-refractive-index member 123 and in contact therewith is, in other words, a member which is exposed before the low-refractive-index member 123 is formed. In this example, the first waveguide member 118 and the second waveguide member 122 correspond to the member described above. That is, in this example, the refractive index of the low-refractive-index member 123 is lower than the refractive index of each of the first waveguide member 118 and the second waveguide member 122. In particular, the low-refractive-index member 123 is formed using a silicon oxynitride film. The refractive index of the silicon oxynitride film is approximately 1.72. In addition, the low-refractive-index member 123 is not necessarily provided. When the low-refractive-index member 123 is not provided, the step shown in FIG. 5A can be omitted.

Figure 5B:
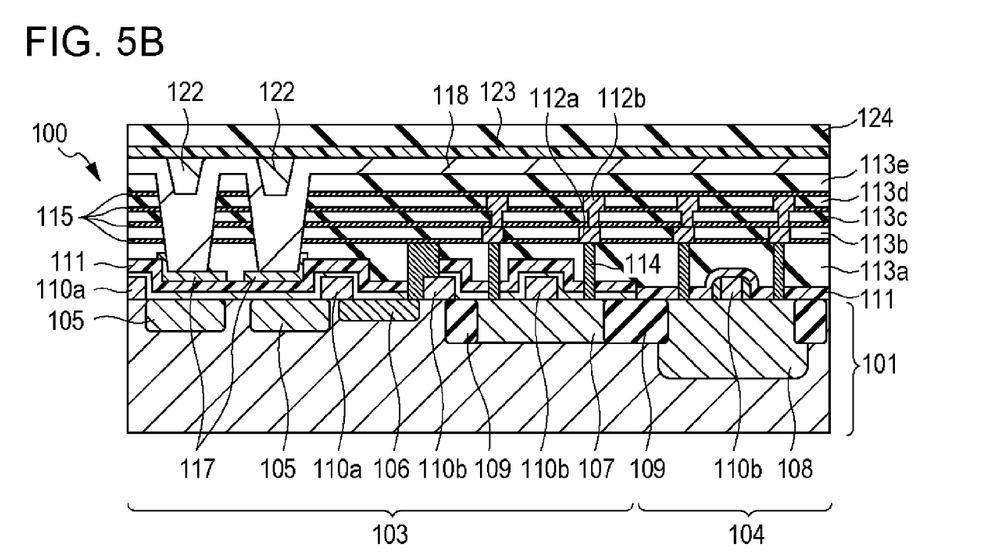

A seventh interlayer insulating film 124 is formed in a step shown in FIG. 5B. The seventh interlayer insulating film 124 is preferably formed from the same material as that of the fifth interlayer insulating film 113e. The surface of the seventh interlayer insulating film 124 opposite to the semiconductor substrate 101 may be planarized, if needed.

Figure 6A:
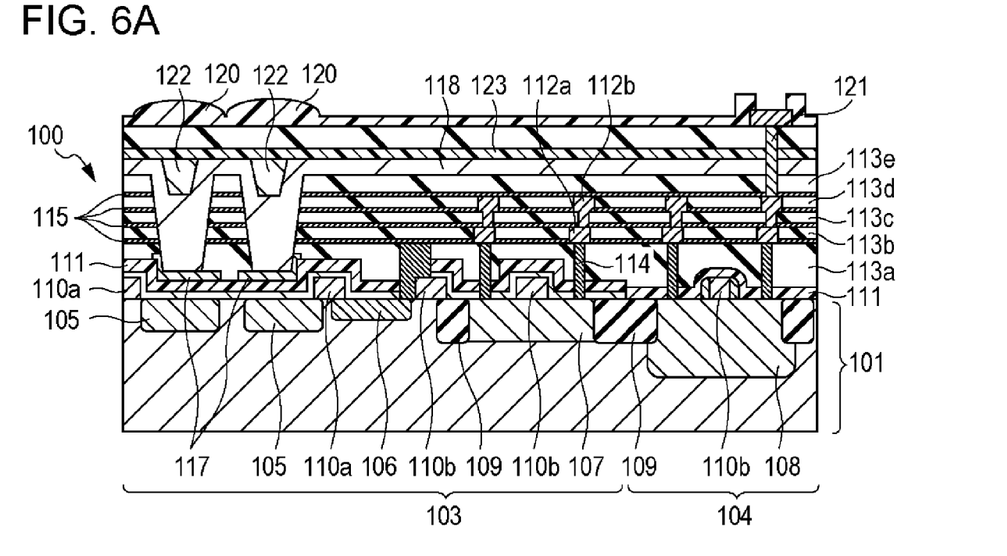
FIGS. 6A and 6B are schematic cross-sectional views each showing the method for manufacturing a solid-state imaging device of Example 2.

In a step shown in FIG. 6A, a through hole 125 is formed at a position of the seventh interlayer insulating film 124 which overlaps the predetermined conductive member of the second wiring layer 112b. The through hole 125 is formed, for example, by etching. An etching method in this case may be performed in a manner similar to that of Example 1. In this etching, the etching rate of the silicon oxynitride film may also be set in accordance with the idea similar to that described above. Alternatively, the silicon oxynitride film may be regarded as a silicon nitride film or a silicon oxide film.

In the step shown in FIG. 6A, furthermore, the plug 121, the third wiring layer 112c, and the inner-layer lenses 120 are formed. First, the plug 121 is formed in the through hole 125. The plug 121 electrically connects the predetermined conductive member of the second wiring layer 112b and the predetermined conductive member of the third wiring layer 112c.

Next, the third wiring layer 112c is formed. In this example, the conductive member of the third wiring layer 112c is formed of aluminum. In addition, as a method for forming the third wiring layer 112c, the method described for forming the first wiring layer 112a or the second wiring layer 112b may be appropriately used. The conductive member of the third wiring layer 112c may be formed of a metal other than aluminum.

Next, the inner-layer lenses 120 are formed. The inner-layer lenses 120 are arranged to correspond to the respective photoelectric conversion portions 105. The inner-layer lens 120 is formed, for example, of a silicon nitride film. A known method may be used as a method for forming the inner-layer lens 120. In this example, a material forming the inner-layer lens 120 is also arranged in the peripheral region 104. However, the material forming the inner-layer lens 120 may be arranged only in the imaging region 103. In this case, the step formed by the third wiring layer 112c can be made indistinctive by the presence of the inner-layer lenses 120.

In addition, between the inner-layer lenses 120 and the seventh interlayer insulating film 124, an intermediate member having an intermediate refractive index between those of the above two constituent elements may be arranged. In this example, a silicon oxynitride film (not shown) is arranged between the inner-layer lenses 120 and the seventh interlayer insulating film 124. In particular, the refractive index of a silicon nitride film (inner-layer lens 120) is approximately 2.00, the refractive index of an oxynitride silicon film (intermediate member) is approximately 1.72, and the refractive index of a silicon oxide film (seventh interlayer insulating film 124) is approximately 1.45.

By the structure as described above, the reflectance can be decreased. The above point will be described briefly. In general, when light travels from a medium having a refractive index n1 to a medium having a refractive index n2, the reflectance increases as the difference between n1 and n2 is increased. In the case in which between the inner-layer lens 120 and the seventh interlayer insulating film 124, the intermediate member having an intermediate refractive index between those of the above two constituent elements is provided, the difference in refractive index at the interface is decreased. As a result, compared to the case in which the inner-layer lens 120 is arranged in contact with the seventh interlayer insulating film 124, the reflectance obtained when light is incident from the inner-layer lens 120 on the seventh interlayer insulating film 124 can be decreased. As in the case described above, between the seventh interlayer insulating film 124 and the second waveguide member 122, when the low-refractive-index member 123 having an intermediate refractive index between those of the above two constituent elements is arranged, the difference in refractive index at the interface is decreased. As a result, when light is incident on the second waveguide member 122 from the seventh interlayer insulating film 124, the reflectance can be decreased.

The degree of decrease in reflectance caused by the arrangement of the intermediate member is changed by the relationship among a thickness d of the intermediate member, a refractive index N thereof, and a wavelength p of incident light. The reason for this is that multiple reflection lights from a plurality of interfaces counteract each other. From a theoretical point of view, when k is an arbitrary integer greater than or equal to 0, the reflectance is most decreased when the conditions represented by a formula (1) is satisfied.

$$d = \frac{p}{4N}(2k+1) \quad (1)$$

That is, when the thickness of the intermediate member is odd number times p/4N, the reflectance is most decreased theoretically. Therefore, the thickness of the intermediate member may be set based on the above formula (1). In particular, the thickness of the intermediate member preferably satisfies the following formula (2). In the formula (2), the case in which k=0 holds is most preferable.

$$\frac{p}{4N}(2k+0.5) < d < \frac{p}{4N}(2k+1.5) \quad (2)$$

For example, the case will be discussed in which the refractive index of the seventh interlayer insulating film 124 is 1.45, the refractive index of the intermediate member is 1.72, the refractive index of the inner-layer lens 120 is 2.00, and the wavelength of incident light is 550 nm. In this case, when the thickness of the intermediate member is assumed to be 80 nm, the transmittance of light transmitting from the inner-layer lens 120 to the seventh interlayer insulating film 124 is approximately 1.00. On the other hand, the transmittance is approximately 0.97 when the inner-layer lens 120 and the seventh interlayer insulating film 124 are arranged in contact with each other.

Figure 6B:
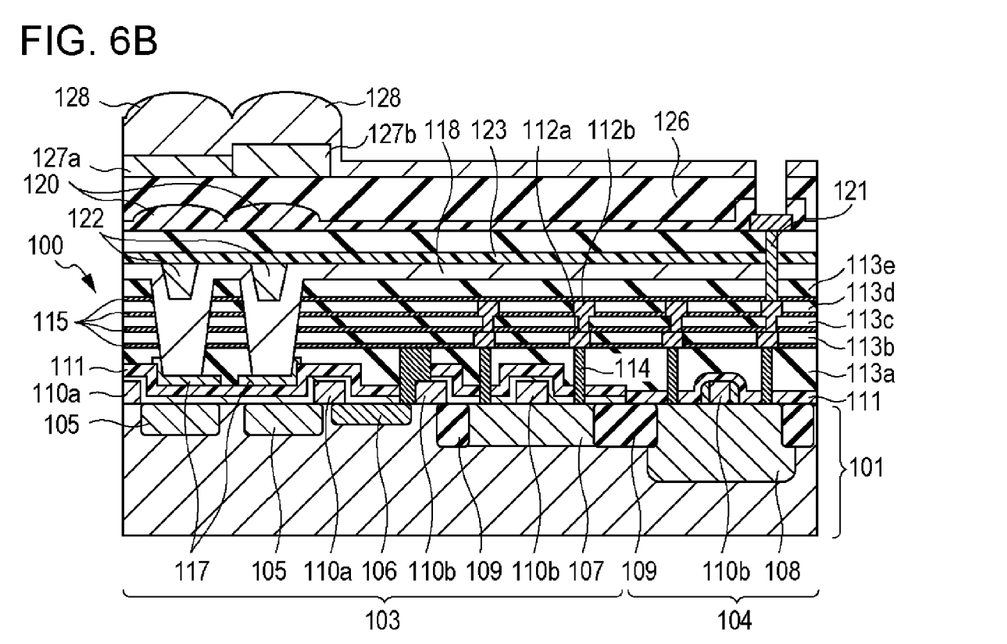

In the step shown in FIG. 6B, color filters 127a and 127b and microlenses 128 are formed. First, the eighth insulating film (planarizing layer) 126 is formed on the inner-layer lenses 120 at a side opposite to the semiconductor substrate 101. The eighth insulating film 126 is formed, for example, of an organic material. A surface of the eighth insulating film 126 opposite to the semiconductor substrate 101 is planarized, if needed. For example, when an organic material forming the eighth insulating film 126 is applied, the eighth insulating film 126 having a planarized surface at a side opposite to the semiconductor substrate 101 can be formed.

Next, the color filters 127a and 127b are formed. The color filters 127a and 127b are arranged to correspond to the respective photoelectric conversion portions 105. The wavelength of light transmitting through the color filter 127a may be different from the wavelength of light transmitting through the color filter 127b. Then, the microlenses 128 are formed on the color filters 127a and 127b at a side opposite to the semiconductor substrate 101. As a method for forming the microlens 128, a known method may be used.

According to the manufacturing method of this example, planarization can be easily performed after the first waveguide member 118 is formed. Therefore, when the inner-layer lenses 120, the color filters 127, or the microlenses 128 are formed, the member thereof can be formed on an under-layer having a high flatness. Therefore, the inner-layer lenses 120, the color filters 127, or the microlenses 128 can be formed with a high precision. As a result, the image quality can be improved.

[The Modification of Example 2]

In Example 2, after the second waveguide member 122 is formed, the planarization step shown in FIG. 4C is performed. However, after the planarization is performed following the step shown in FIG. 4A, the second waveguide member 122 may be formed.

As has thus been described, according to the present invention, a semiconductor device having a high precision can be provided. In addition, a semiconductor device can be manufactured with a high precision. In particular, a solid-state imaging device having a high image quality can be provided and manufactured. In addition, the above embodiments are merely described as specific examples upon embodying the present invention, and a technical scope of the present invention must not be limitedly interpreted thereby. That is, the present invention can be carried out in various forms without departing from its technical idea or its principal features. For example, the individual examples described above may also be appropriately used in combination.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-223299 filed Oct. 7, 2011 and No. 2011-026354 filed Feb. 9, 2011, which are hereby incorporated by reference herein in their entirety.

What is claimed is:

1. The semiconductor device comprising:
   a semiconductor substrate including a first region and a second region;
   an insulator which is arranged in the first region and the second region of the semiconductor substrate and which has an opening in the first region;
   a wiring layer enclosed by insulator;
   a first member provided inside the opening and on the insulator in the second region;
   a plug which includes a conductive material, which penetrates the first member provided on the insulator through a through hole formed by openings in the first member and the insulator in the second region, and which is connected to the wiring layer;
   an insulating film on the first member, the insulating film being penetrated by the plug together with the first member;
   another wiring layer on the insulating film and the plug;
   a planarizing layer covering at least a part of the another wiring layer; and
   a color filter and a microlens on the planarizing layer.

2. The semiconductor device according to claim 1, further comprising:
   a photoelectric conversion portion provided in the first region; and
   a signal processing circuit which is provided in the second region and which processes a signal from the photoelectric conversion portion,
   wherein the opening is located above and corresponds to the photoelectric conversion portion, and
   the first member has a refractive index higher than that of the insulator and forms a waveguide with the insulator.

3. The semiconductor device according to claim 1, wherein the insulator includes a plurality of insulating films.

4. The semiconductor device according to claim 1, further comprising a second member provided inside the opening and on the first member, wherein the plug penetrates the second member and the first member.

5. The semiconductor device according to claim 1, wherein in the second region, the insulator has a flat upper surface, and the first member has a flat upper surface.

6. The semiconductor device according to claim 1, wherein the conductive plug contacts the first member.

7. The semiconductor device according to claim 1, wherein the first member includes a silicon nitride film.

* * * * *